United States Patent [19]
Bashir et al.

[11] Patent Number: 5,827,762
[45] Date of Patent: Oct. 27, 1998

[54] METHOD FOR FORMING BURIED INTERCONNECT STRUCTUE HAVING STABILITY AT HIGH TEMPERATURES

[75] Inventors: Rashid Bashir, Santa Clara; Francois Hebert, San Mateo; Datong Chen, Fremont, all of Calif.

[73] Assignee: National Semiconductor Corporation, Santa Clara, Calif.

[21] Appl. No.: 850,603

[22] Filed: May 2, 1997

[51] Int. Cl.$^6$ ................................................ H01L 21/8238
[52] U.S. Cl. .......................... 438/202; 438/488; 438/592; 438/585; 438/618; 438/647; 438/656; 438/657; 438/659; 438/660; 438/655; 438/683; 438/669; 438/684
[58] Field of Search .................................. 438/202, 592, 438/655, 656, 657, 683, 585, 660, 352, 360, 488, 618, 647, 659, 669, 684; 257/755, 770; 148/DIG. 147

[56] References Cited

U.S. PATENT DOCUMENTS

| | | | |
|---|---|---|---|
| 4,443,930 | 4/1984 | Hwang et al. | 29/571 |
| 4,719,477 | 1/1988 | Hess | 346/140 |
| 4,975,756 | 12/1990 | Haken et al. | 357/4.1 |
| 5,010,032 | 4/1991 | Tang et al. | 437/57 |
| 5,124,280 | 6/1992 | Wei et al. | 437/193 |
| 5,187,122 | 2/1993 | Bonis | 437/200 |
| 5,201,993 | 4/1993 | Langley | 156/643 |
| 5,318,924 | 6/1994 | Lin et al. | 437/192 |
| 5,323,049 | 6/1994 | Motonami | 257/401 |
| 5,326,424 | 7/1994 | Doll et al. | 117/105 |
| 5,332,913 | 7/1994 | Shappir | 257/305 |
| 5,349,229 | 9/1994 | Wei et al. | 257/383 |
| 5,365,112 | 11/1994 | Ohsima | 257/784 |
| 5,414,302 | 5/1995 | Shin et al. | 257/752 |
| 5,418,179 | 5/1995 | Hotta | 437/57 |
| 5,506,158 | 4/1996 | Eklund | 437/41 |
| 5,624,871 | 4/1997 | Teo et al. | 438/453 |

OTHER PUBLICATIONS

Cheng, H.C. et al., "The Effect of Gate Electrodes Using Tungsten Silicides and/or Poly–Silicon on the Dielectric Characteristics of Very Thin Oxides," *Solid–State Electronics,* vol. 33, No. 3, pp. 365–373, (1990).

Wolf, S. "Local Interconnects," *Silicon Processing for the VLSI Era—vol. 2: Process Integration,* (Chap. 3.11.2) pp. 162–169, Lattice Press (1990).

*Primary Examiner*—John Niebling
*Assistant Examiner*—Long Pham
*Attorney, Agent, or Firm*—Limbach & Limbach L.L.P.

[57] ABSTRACT

A buried interconnect structure which is stable at the high temperatures involved in BiCMOS, bipolar, and CMOS transistor process flows, and a method of making the same. The interconnect structure is fully insulated and can be used to form stable, doped structures suitable for use as electrodes and gate structures in a CMOS process, or to form low resistance contacts to N or P-type silicon as part of a bipolar process. Because the interconnect structure is buried and fully insulated from surrounding structures, it may be used to form complex, multi-level devices having a minimized geometry and increased circuit density.

12 Claims, 3 Drawing Sheets

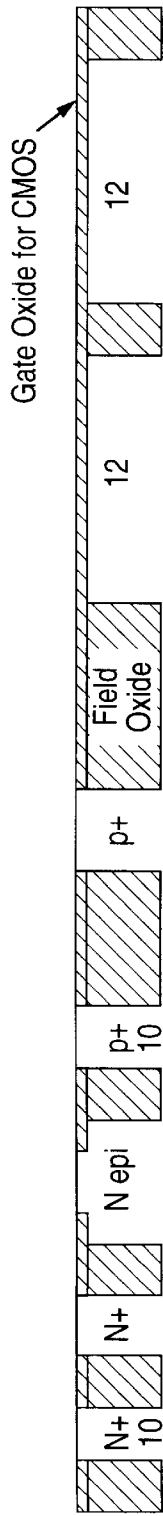
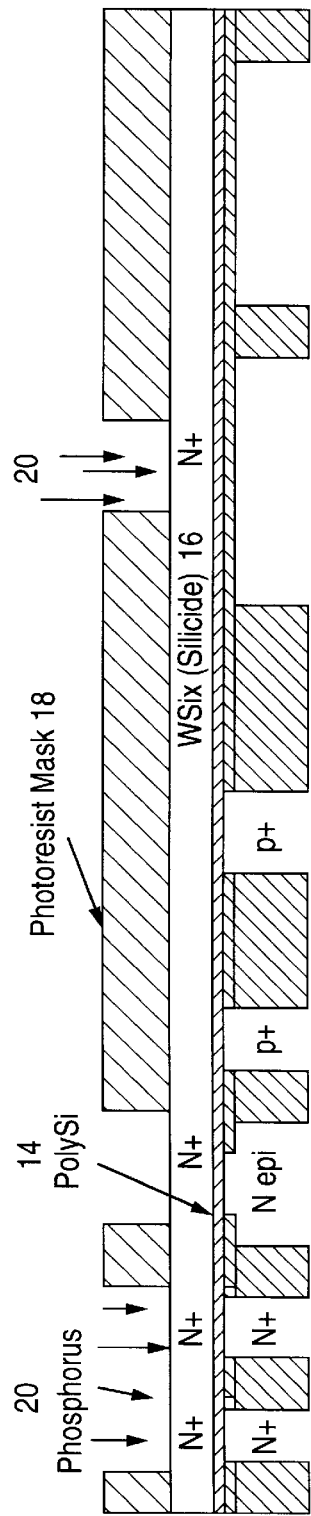
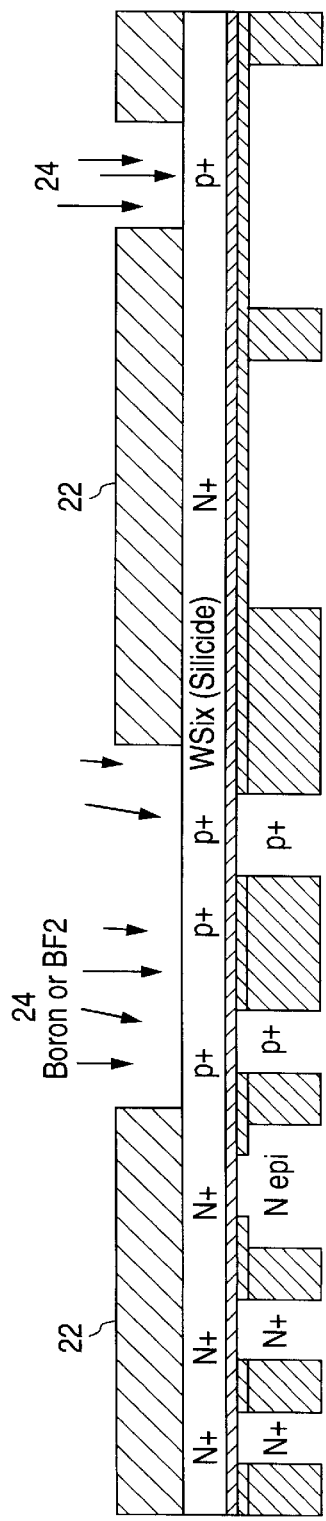

METHOD FOR FORMING BURIED INTERCONNECT STRUCTUE HAVING STABILITY AT HIGH TEMPERATURES

TECHNICAL FIELD

The present invention is directed to local interconnect structures used to electrically connect device regions formed on a semiconductor substrate, and more specifically, to an insulated and buried local interconnect structure which is stable at the high temperature levels used in certain MOS and bipolar integrated circuit process flows. The interconnect structure described may be used to form low resistance contacts to either N or P-type silicon, and to form the base electrode for bipolar devices or the gate electrode for MOS devices.

BACKGROUND OF THE INVENTION

Local interconnect structures are used to electrically connect the diffusion regions of different transistors fabricated on a common substrate, and to connect diffusion regions to gate layers. The structures are typically formed from a polysilicon layer. A polysilicon layer may also be used to form the gate electrode for certain of the transistors. However, the use of polysilicon to form local interconnects has several disadvantages. When the polysilicon layer is used as an interconnect, it cannot cross over regions where a transistor gate is formed without making an electrical contact to the gate. Therefore, if such a contact is not desired, the polysilicon interconnect structure cannot be used in that region. Polysilicon also has a much higher sheet resistance than that of other possible interconnect materials. This reduces its utility as a conductive interconnect element.

As a result of polysilicon's limitations, other materials have been investigated for use as possible interconnect structures. For example, local interconnects in NMOS devices have been formed from bilayer conductor structures. These bilayer conductors are formed from a refractory metal-silicide layer (e.g. $WSi_2$, $TaSi_2$, $MoSi_2$, or $TiSi_2$) on top of a polysilicon layer, and are referred to as polycides. Polycides have the benefit of having a lower resistivity than heavily doped polysilicon. Polycide structures, and silicide structures formed from a layer of the metal-silicide by itself are used for the formation of electrodes in high-temperature process flows.

However, some popular polycide and silicide structures are not stable at high temperatures. For example, $TiSi_2$ forms a high resistance contact to P+ silicon due to the formation of Ti—B compounds at temperatures above 950° C. Furthermore, $TiSi_2$ and $CoSi_2$ agglomerate when exposed to temperatures in excess of 1000° C., resulting in increased sheet resistance. This is inconsistent with the use of such materials for interconnects.

Another problem is that self-aligned silicides and polycides formed using the SALICIDE process typically used are not fully insulated unless additional processing steps are used to provide full isolation of the film. This is because while the sidewalls of the region are isolated by spacers, the top region, where the silicidation reaction occurs, is exposed and not isolated. The result is that an exposed conductive surface is left on top of the silicide region. The lack of full insulation means that either a more complex process flow must be used to provide a fully insulated interconnect region or that further processing on the top surface of the substrate is limited by the need to maintain electrical isolation between the silicide/polycide regions and other features of the device.

Because of this isolation problem, buried silicide regions are sometimes used. While interconnects formed from buried regions are stable at high temperatures, there are disadvantages. These include the need to use high-dose implants which generate defects in the silicon substrate to form the buried regions and that this process cannot be used to form low resistance gates for a FET device. In addition, while $CoSi_2$ is a preferred material for such interconnects, it is not stable at temperatures above 1000° C. This makes buried silicide interconnects formed from $CoSi_2$ unsuited for use in processes which include high temperature steps.

Certain conductors, while stable at high temperatures, have features which make them less desirable for use in forming interconnect structures. Polysilicon has a relatively high melting temperature and is used as a gate material and local interconnect, but as noted, its sheet resistance is high (more than 10 times that of polycide or silicide materials). Another high temperature conductor which has been suggested for use in forming interconnects is $WSi_x$. However, some of the technical literature suggests that this material degrades at a temperature of 1000° C. and thus may not be a good choice for use in forming local interconnects using high temperature process flows. The contradictory literature regarding the use of $WSi_x$ to form conductors as part of a high temperature process clouds the issue of the suitability of the material.

U.S. Pat. No. 4,443,930 to Hwang et al., issued Apr. 24, 1984, describes a process for forming a layer of silicon rich metal silicide having a low resistivity. The material may then be patterned to form gate and interconnect structures. However, the '930 patent does not disclose details regarding selective doping of the structure with implants and the structures are not fully insulated or passivated. This limits the usefulness of the structures for fabricating complex, multi-layer devices.

The art does not disclose how to form a stable and doped $WSi_x$ electrode or gate structure compatible with CMOS process flows involving temperatures in excess of 1000° C. The art also does not disclose how to form a low resistance interconnect structure to provide a contact to low doped N or P-type silicon as part of a bipolar process.

What is desired is a local interconnect structure and method of forming the same, which is stable at temperatures in excess of 1000° C. and can be used to form gate structures as part of BiCMOS and CMOS process flows, or to form low resistance contacts to N or P-type silicon as part of a bipolar process. In addition, it is desired that the interconnect structure be fully insulated and of minimum geometry. This makes the interconnect structure suited for use in the fabrication of high performance devices and for increasing the density of circuits fabricated on a substrate. These and other advantages of the present invention will be apparent to those skilled in the art upon a reading of the Detailed Description of the Invention together with the drawings.

SUMMARY OF THE INVENTION

The present invention is directed to a buried interconnect structure which is stable at the high temperatures involved in BiCMOS, bipolar, and CMOS transistor process flows, and a method of making the same. The interconnect structure is fully insulated and can be used to form stable, doped structures suitable for use as electrodes and gate structures in a CMOS process, or to form low resistance contacts to N or P-type silicon as part of a bipolar process. Because the interconnect structure is buried and fully insulated from surrounding structures, it may be used to form complex, multi-level devices having a minimized geometry and increased circuit density.

The interconnect structure is formed by depositing a tungsten silicide film over the surface of a substrate on which active regions have been formed and contact regions exposed. In the portions of the substrate surface on which an oxide layer has been deposited, the inventive method is used to form a fully insulated gate electrode for a CMOS device. In the portions of the substrate surface on which no oxide layer is present, the inventive method is used to form a low resistance contact to N or P-type silicon as part of a bipolar device. The deposited tungsten silicide film has a thickness in the range of 500 to 5000 Å and a composition of the form $WSi_x$, with x in the range between 2.0 and 3.0. If desired, the previously defined N+ and P+ active device regions of the substrate may then be masked and the appropriate species implanted into the $WSi_x$ layer to dope it to the desired N+ or P+ characteristic. A capping insulator layer is then deposited over the silicide layer.

The interconnect structures are then defined and the insulator/silicide or insulator/polycide structure is etched using a reactive ion etch process. Sidewall insulation of the etched regions is then accomplished by an oxidation or anneal step. For the regions of the substrate in which CMOS devices will be formed, a lightly doped drain mask and implant is then performed. A conformal layer of oxide or a nitride layer is then deposited over the surface of the substrate. Sidewall spacers are then etched using an anisotropic dry etch. For the regions of the substrate in which low resistance contacts for bipolar devices are to be formed, high dose contact implants to silicon are then performed. Final drive-in and planarization at a temperature in excess of 1000° C. is then performed. The contact regions are then etched and a metal layer is deposited.

Further objects and advantages of the present invention will become apparent from the following detailed description and accompanying drawings.

BRIEF DESCRIPTION OF THE DRAWINGS

FIGS. 1(a) through 1(e) show the process flow for forming a low resistance interconnect structure suitable for use as a gate electrode for a CMOS device or as a low resistance contact to N or P-type silicon for a bipolar device according to the method of the present invention.

DETAILED DESCRIPTION OF THE INVENTION

The present invention will be described in the context of forming contacts to N+ or P+ doped substrate regions in which bipolar devices are to be formed and a gate electrode in a substrate region in which a CMOS device is to be formed. It is to be understood that this description is for purposes of example only, and that the present invention is compatible with BiCMOS, bipolar, and CMOS process flows and may be used to form contacts to, or electrodes for, devices formed by any of those processes, either on a single substrate or different substrates.

Figure 1D:
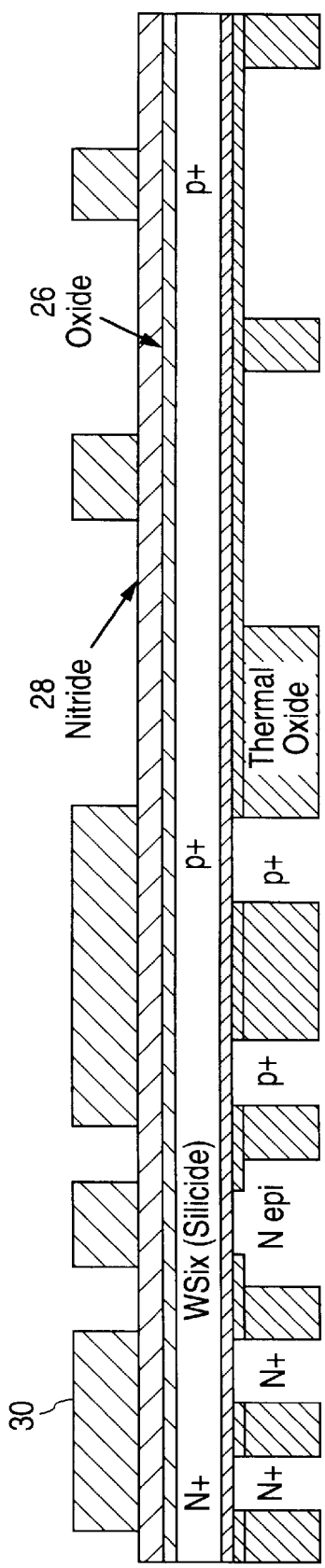

FIGS. 1(a) through 1(e) show the process flow for forming a low resistance interconnect structure suitable for use as a gate electrode for a CMOS device or as a low resistance contact to N or P-type silicon for a bipolar device according to the method of the present invention. FIG. 1(a) shows a substrate on which active device regions 10 for a bipolar structure (labelled "N+" and "p+" in the figure) and a CMOS structure 12 have been formed by the usual process of field oxide formation, active device region definition, and formation of isolation structures. Active regions 10 which require contacts are then exposed by removing the overlying layer of oxide. Thus, in the example shown in FIG. 1(a), the N+ and p+ regions require contacts, and the gate of a field effect device is to be formed over region 12. The gate is formed over the layer of oxide (labelled "gate oxide for CMOS" in the figure) which has previously been deposited on the substrate.

A thin layer of polysilicon 14 may then be deposited over the surface of the substrate, as shown in FIG. 1(b). Polysilicon layer 14 is typically between 500 and 2000 Å in thickness. Polysilicon layer 14 is optional and is used if it is desired to form a polycide interconnect structure. If polysilicon layer 14 is not used, a silicide will be used to form the interconnect. A tungsten silicide film 16 of typical thickness between 500 and 5000 Å is then deposited. Silicide film 16 has the composition $WSi_x$, where x has a value between two and three (2.0<x<3.0). A mask 18 may then be used to implant phosphorus 20 into those regions of silicide layer 16 which are to be doped N+. A dose of $4 \times 10^{15}$ to $8 \times 10^{15}$ ions/cm$^2$ would typically be used. This step is optional and depends upon the doping characteristics desired for the silicide or polycide layer of the final device.

A second mask 22 (see FIG. 1(c)) may then be used to protect the N+ doped regions of silicide layer 16 for purposes of implanting Boron (or $BF_2$) 24 into those regions of layer 16 which are to be doped P+. A dose of $4 \times 10^{15}$ to $8 \times 10^{15}$ ions/cm$^2$ would typically be used. As with the previous step, this step is optional and depends upon the characteristics desired for the silicide or polycide layer of the final device.

A capping insulator layer is then deposited over the surface of the substrate. The capping insulator may be formed from an undoped oxide layer of typical thickness between 1500 and 3000 Å, an oxide/nitride sandwich, or an oxide/nitride/oxide sandwich. In FIG. 1(d), the capping insulator is shown as an oxide/nitride sandwich formed from a 500 to 2000 Å thick layer of oxide 26 over which is deposited a 200 to 1000 Å thick layer of nitride 28. If an oxide/nitride/oxide sandwich is used, a top layer of oxide of thickness 200 to 1000 Å is deposited over nitride layer 28. A layer of resist 30 is then applied and patterned to define the desired interconnect regions.

The silicide/polycide and capping insulator layers which are not protected by the resist layer are then etched away in the regions which are not intended to be used as contacts/electrodes. This can be accomplished by dry etching using a reactive ion etch process. The resist, insulator, and silicide/polycide layers are typically etched in a multi-step process which is modified to be highly selective to the desired endpoint material at each step. A gas mixture suitable for etching the overlying insulator layer in a reactive ion etch is composed of $CHF_3$ and $C_2F_6$ (in a ratio of 114:38, using He as a wafer backside coolant gas). The silicide layer can then be anisotropically etched in a reactive ion etch using a gas mixture formed from $Cl_2$ and $C_2F_6$, with sufficient $O_2$ added to control polymer formation and prevent undercutting of the silicide (in a $Cl_2:C_2F_6:O_2$ ratio of 35:100:20). The polysilicon layer (if present) can then be etched in a reactive ion etch using a gas mixture formed from $Cl_2$ and $C_2F_6$ (in a ratio of 50:85, using He as a wafer backside coolant gas).

A description of a highly anisotropic dry etch process based on the described chemistries which is suited for etching an insulator/silicide/polysilicon stack is described in the U.S. patent application entitled "TUNGSTEN SILICIDE/ TUNGSTEN POLYCIDE ANISOTROPIC DRY ETCH PROCESS" Ser. No. 08/850,573, assigned to the assignee of the present invention, and filed the same day as the present application, the contents of which are hereby incorporated by reference.

Figure 1E:
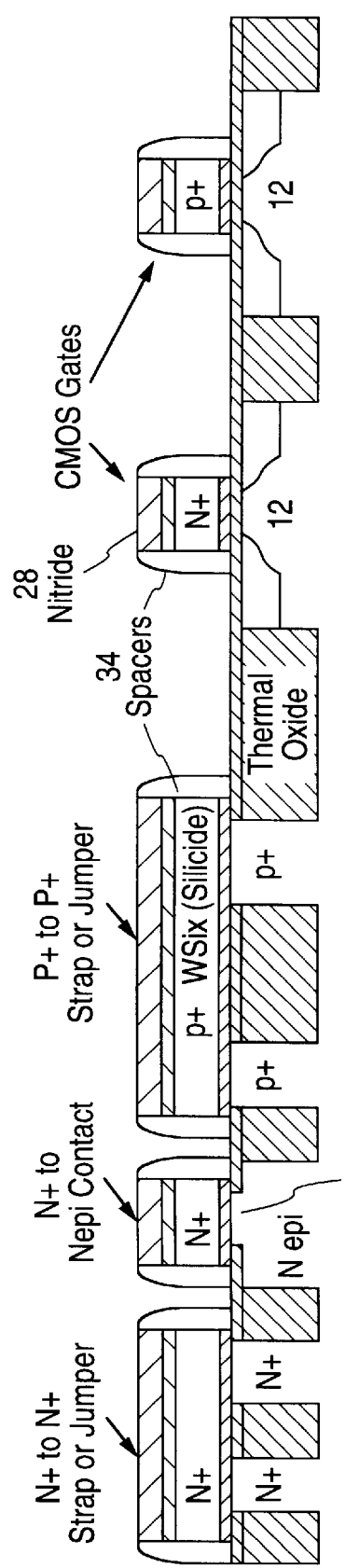

After the dry etch steps, the remaining resist is then removed. FIG. 1(e) shows the result of such an etch, after removal of the remaining portions of the resist layer. The exposed sidewalls of the interconnect regions may then be subjected to an optional step of oxidation or an anneal. A lightly doped drain (LDD) mask and implant step is then performed to form the NMOS and PMOS transistors which are part of the CMOS devices being formed in region 12 of the substrate.

A layer of conformal oxide or nitride for use in forming sidewall spacers 34 is then deposited over the substrate. Sidewall spacers 34 are then formed by etching the oxide or nitride layer using a standard anisotropic dry etch process for spacers known in the semiconductor industry. The resulting structure is shown in FIG. 1(e).

The CMOS gate electrode formation steps are followed by a final drive-in and planarization at temperatures in excess of 1000° C. A rapid thermal anneal (RTA) at temperatures of 1000° to 1050° C. is suitable for this purpose.

As has been discussed, the present invention may also be used to form low resistance contacts to N+ or P+ doped regions as part of the fabrication of bipolar devices. Returning to FIG. 1(d), a resist layer (not shown) is applied and patterned to define the desired regions for the low resistance contacts to the bipolar device(s) formed in the substrate. The contacts may be used provide electrical connection to low-doped or undoped silicon, or to create junctions for the devices. The doping of the silicide/polycide layer in the contact regions may be performed prior to deposition of the capping insulator layer (as has been described) or after formation of the capping insulator. If the silicide/polycide layer is doped after deposition of the capping insulator, greater energies are generally required.

Resist layer 30 is then applied and patterned to define the desired interconnect/contact regions. The silicide/polycide and capping insulator layers which are not protected by the resist layer are then etched away in the regions which are not intended to be used as contacts. This can be accomplished by use of the reactive ion etch process previously described.

After the dry etch steps, the remaining resist is then removed. The exposed sidewalls of the interconnect regions may then be subjected to an optional step of oxidation or an anneal. To complete the processing of the devices on the substrate, high dose source-drain or emitter implants into silicon may then be performed in the regions in which the contacts to bipolar devices are to be formed. For the source-drain implants, a typical dopant would be Boron at a dose of $5 \times 10^{15}$ to $1 \times 10^{16}$ ions/cm$^2$. If Arsenic is used as the dopant, a similar dose would be used. For a PNP emitter, a typical dopant would be Boron at the dose given above. For an NPN emitter, a typical dopant would be Arsenic at the dose given above.

After the appropriate implants, a layer of oxide is deposited, followed by the remaining contact formation steps. The contact formation steps are followed by a final drive-in at temperatures in excess of 1000° C. A rapid thermal anneal (RTA) at temperatures of 1000° to 1050° C. is suitable for this purpose. The defined contact regions are then etched to remove the oxide layer and a metal layer is deposited.

As shown in FIG. 1(e), the structure resulting from practice of the present invention includes fully insulated, buried interconnect, electrode, and contact regions formed on the same substrate as bipolar and CMOS devices. The compatibility of the present invention with bipolar, BiCMOS, and CMOS processes makes it extremely useful for forming local interconnect, gate electrode, and low resistance contacts for a wide variety of applications.

An important difference between the regions in which the bipolar and CMOS devices are formed is that the lack of a gate oxide layer in the bipolar regions permits the doped silicide/polycide layer to serve as a dopant source for the underlying silicon substrate. The result is that the N or P type dopants implanted into silicide/polycide layer 16 diffuse into the silicon substrate, forming a doped silicon region with an overlying contact.

The method of the present invention permits the formation of a fully insulated interconnect structure which is stable at temperatures in excess of 1000° C. The interconnect structure may be used to form low resistance contacts to N or P type silicon for bipolar devices, or to form electrodes for CMOS devices. The primary features of the interconnect structure are:

1. the conducting region is fully isolated on all sides by self-aligned techniques to minimize the line width and pitch of the interconnect structure. This allows the formation of complex, multi-level structures with an increased circuit density;

2. the sheet resistivity of the conducting region is less than 100 micro-ohms-cm at temperatures over 1000° C.;

3. the structure may be used to form low resistance contacts to both N and P type silicon of any doping characteristic;

4. the structure can be used as a gate electrode for FET devices; and 5. the structure may be used to form an emitter, base, and/or collector electrodes for a bipolar device.

The inventors of the present invention have discovered that the following key parameters influence the stability of the local interconnect structure:

1. the type of dopant implanted into the silicide layer;

2. the dose and energy of the dopant implanted into the silicide;

3. the composition of the insulator layer(s) formed on the silicide/polycide layer; and 4. the annealing ambient and temperature used in the anneal step.

The influence of each of the above parameters on the stability of the interconnect structure will now be discussed in greater detail.

The inventors have discovered that Boron implants in the silicide film produce stable films, even when the films are exposed to very high temperatures. Boron is capable of forming low resistance contacts for bipolar devices since it readily diffuses through the silicide or polycide film to dope the underlying silicon. Phosphorus has been found to degrade the film stability if the implant dose is too high. Phosphorus is preferred as the dopant species to Antimony or Arsenic since the faster diffusion of Phosphorus through the silicide or polycide layer will form the desired low resistance contact to the underlying silicon. Although Phosphorus is preferred, Arsenic was found to behave like Phosphorus, i.e., a silicide/polycide layer doped with Arsenic or Phosphorus is more susceptible to peeling than one doped with Boron.

Figure 2:
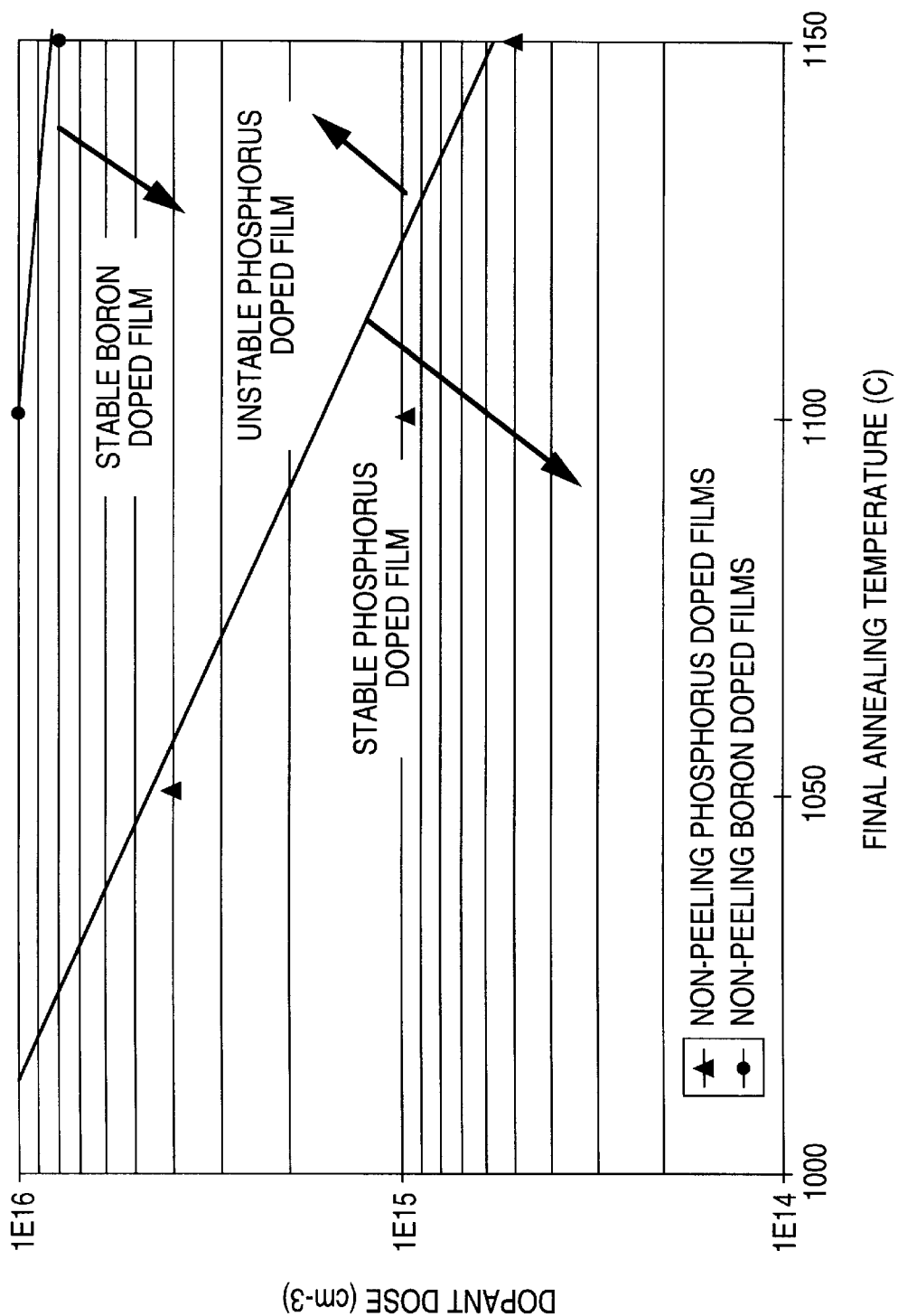
FIG. 2 is a graph plotting final annealing temperature (in degrees celsius) versus dopant dose (in ions per cm$^3$) for Boron and Phosphorus implanted silicide/polycide films which shows the regions of stability and instability of the doped films.

With regards to the dose and energy of the implanted species, it was found that the energy of the implant had little or no effect on the stability of the silicide/polycide film. The dose, however, was found to have an effect on the stability. This behavior is shown in FIG. 2, which is a graph plotting final annealing temperature (in degrees celsius) versus dopant dose (in ions per cm$^3$) for Boron and Phosphorus implanted silicide/polycide films and shows the regions of stability and instability of the doped films. The graph clearly shows the combinations of anneal temperature and dopant dose which form regions of implanted film stability and instability (peeling). Roughly, p-type dopants such as Boron may be used at doses up to approximately $1 \times 10^{16}$ ions/cm$^3$ to obtain films which are stable at temperatures up to 1100° C. N-type dopants such as Phosphorus be used at doses up to approximately $4 \times 10^{15}$ ions/cm$^3$ to obtain films which are stable at temperatures up to 1050° C. It is noted that Arsenic was found to have a behavior similar to that of Phosphorus.

The inventors also determined that the composition and thickness of the insulator layer(s) formed on the silicide/polycide layer had an effect on the stability of the film. When an insulator layer composed of nitride only was used, it was found to result in peeling of the film at temperatures and doses lower than that of other insulators. When a layer of oxide alone is used as the insulation layer, it was found that its thickness should be greater than 2000 Å, and preferably around 3000 Å if an oxidizing densification anneal step is used. In the case of using a neutral ambient for the drive-in, the oxide thickness may be reduced. The combination of an oxide layer under a nitride layer (an oxide/nitride sandwich) permits the use of thinner oxide layers with oxidizing ambients (because the nitride blocks the oxygen diffusion). This is the preferred insulator configuration for the silicide/polycide capping layer.

With regards to the annealing ambient and temperature, it was found that the silicide/polycide films were stable after oxidation at 900° C. when the specified thicknesses, doses, dopant species, and insulator layer compositions were used. This temperature is typical of that encountered during a densification of the insulator cap oxide or an oxidation of the sidewalls after patterning of the silicide/polycide layer.

Other parameters of interest investigated by the inventors included the composition of the silicide layer, i.e., the value of (x) in WSi$_x$. It was found that the less silicon in the tungsten-silicon alloy, the greater the incidence of peeling of the film during the high temperature stages of the process. For the purposes for which the electrodes and contacts formed using the present invention are intended, a value of x between 2.0 and 3.0 (2.0<x<3.0) is preferred, with a value of 2.6 forming the basis for most of the experiments conducted by the inventors.

In general, the higher the temperature of the process step, the greater the incidence of peeling of the film. It was found that Boron implanted films were more stable than Phosphorus and that such films (if of the proper composition) can endure temperatures in excess of 1100° C. without significant peeling.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A method of forming a fully insulated local interconnect structure which is stable at high temperatures on a substrate on which an active device region is formed, the method comprising:

depositing a layer of a silicide film over the substrate;

doping the layer of silicide film;

depositing a layer of an insulator over the silicide film;

forming a patterned photoresist over said layer of insulator to define said local interconnect structure on the insulator surface;

removing said deposited silicide film and insulator down to the substrate in regions outside of the defined local interconnect structure;

forming a spacer on sidewalls of the defined local interconnect structure; and annealing the local interconnect structure at a temperature in excess of 1000° C.

2. The method of claim 1, wherein the silicide film is doped with a p-type dopant at a dose of approximately $1 \times 10^{16}$ ions/cm$^3$.

3. The method of claim 2, wherein the p-type dopant is Boron.

4. The method of claim 1, wherein the silicide film is doped with an n-type dopant at a dose of approximately $4 \times 10^{15}$ ions/cm$^3$.

5. The method of claim 4, wherein the n-type dopant is Phosphorus.

6. The method of claim 1, wherein before the step of depositing a layer of a silicide film over the substrate, the method further comprises:

depositing a layer of polysilicon over the substrate.

7. A method of forming a fully insulated electrode structure which is stable at high temperatures on a substrate on which an active device region has been defined, comprising:

forming a layer of gate oxide over the surface of the substrate;

depositing a layer of a silicide film over the layer of gate oxide;

depositing a layer of an insulator over the silicide film;

forming a patterned photoresist over said layer of insulator to define said electrode structure on the insulator surface;

removing said deposited silicide film and insulator down to the substrate outside of the defined electrode structure;

forming a spacer on sidewalls of the defined electrode structure; and annealing the electrode structure at a temperature in excess of 1000° C.

8. The method of claim 7, wherein the silicide film is doped with a p-type dopant at a dose of approximately $1 \times 10^{16}$ ions/cm$^3$.

9. The method of claim 8, wherein the p-type dopant is Boron.

10. The method of claim 7, wherein the silicide film is doped with an n-type dopant at a dose of approximately $4 \times 10^{15}$ ions/cm$^3$.

11. The method of claim 10, wherein the n-type dopant is Phosphorus.

12. The method of claim 7, wherein before the step of depositing a layer of a silicide film over the substrate, the method further comprises:

depositing a layer of polysilicon over the substrate.

* * * * *